June 25, 1963 J. R. LIGENZA 3,095,341
PHOTOSENSITIVE GAS PHASE ETCHING OF SEMICONDUCTORS
BY SELECTIVE RADIATION
Filed June 30, 1961

INVENTOR
J. R. LIGENZA
BY H W Lockhart
ATTORNEY

United States Patent Office 3,095,341

Patented June 25, 1963

3,095,341

PHOTOSENSITIVE GAS PHASE ETCHING OF SEMICONDUCTORS BY SELECTIVE RADIATION

Joseph R. Ligenza, Westfield, N.J., assignor to Bell Telephone Laboratories, Incorporated, New York, N.Y., a corporation of New York Filed June 30, 1961, Ser. No. 121,065
9 Claims. (Cl. 156—17)

This invention relates to selective etching techniques.

More particularly, this invention relates to the gas phase, photo-sensitive etching of a layer of material which forms a volatile halide.

In this connection, the term "photo-sensitive" characterizes a gas or mixture of gases which normally is substantially unreactive with the selected material but which is activated when exposed to radiation as described in detail in copending application Serial No. 94,056 filed March 7, 1961, for J. R. Ligenza and H. M. Shapiro.

In the manufacture of diffused semiconductor devices, particularly diffused silicon devices, it is customarily the procedure to form a diffusion-resistant layer over the silicon wafer and selectively etch through such layer to form of it a diffusion-resistant mask of prescribed configuration. In this manner the subsequent diffusion step is monitored by the mask and, accordingly, the area of the PN junction formed as a consequence of the diffusion step is subject to strict control.

Typically, the diffusion-resistant layer is selectively etched by the photo-resist technique, for example as described in Patent No. 2,802,760, issued August 13, 1957, to L. Derick and C. J. Frosch, adapted, as disclosed, in copending application Serial No. 678,411, filed August 15, 1957, for J. Andrus. Although the photo-resist technique is highly accurate and widely accepted commercially, it has certain disadvantages which make the technique difficult to employ and, accordingly, expensive to use. One of these disadvantages is the non-uniformity of the photo-resist material itself requiring testing and modification of the procedure from batch to batch. Another disadvantage is that the technique leaves on the surface of the semiconductor an organic residue which is not uniform from device to device and which deteriorates the electrical properties of the device. Moreover, problems are encountered in removing the organic residue and as a result the residue is removed to a varying degree from device to device. Accordingly, devices produced from a given batch of photo-resist material tend to exhibit a wide range of characteristics.

A broad object of this invention is a simple and inexpensive process for shaping a layer of material.

A more specific object of this invention is a process for selectively etching a diffusion-resistant overlayer for leaving a diffusion-resistant mask of prescribed configuration suitable for monitoring a subsequent diffusion of conductivity-type determining, or significant, impurities into a semiconductor substrate.

A further object of this invention is a process for reproducing a pattern directly on a layer of material without the necessity for a negative-positive procedure typical of photographic processes.

This invention is based on the discovery that a radiation pattern incident upon a surface disposed in a particular gaseous ambient including gases such as $NF_3$ (nitrogen trifluoride) and $Br_2$ (bromine) can be made to stimulate etching only in the shadowed areas of the surface.

Accordingly, in one specific embodiment of this invention nitrogen trifluoride gas is bubbled through liquid bromine at room temperature and atmospheric pressure and the resulting gaseous mixture is introduced at normal operating temperatures to an inert enclosure equipped with a window which is transparent to radiation of suitable wavelengths. A silicon semiconductor wafer coated with an overlayer of thermally grown silicon dioxide is disposed in the enclosure and a mask is placed in contact with the wafer appropriately disposed with respect to a suitable radiation source so that the mask shadows the portion of the coating desired to be removed and thereafter the assembly is irridiated by the source. The results selective etching only of the shadowed portions of the oxide coating.

Accordingly, a feature of this invention is the shadowing of a portion of a silicon dioxide coating in an $NF_3$ and $Br_2$ gaseous mixture from radiation in accordance with a pattern for selectively etching the coating.

Further objects and features of this invention will be understood more fully from the following detailed discussion rendered in relation to the drawing, wherein.

It is to be understood that the figures are not necessarily to scale, certain dimensions being exaggerated for illustrative purposes.

Figure 1:
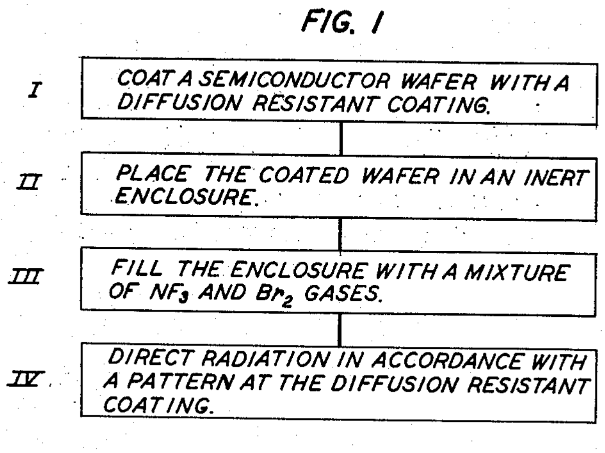
FIG. 1 is a flow chart representing the steps of the method of this invention.

The first step in accordance with this invention is to coat the surface of the semiconductor wafer with a diffusion-resistant coating as is indicated by block I of the flow chart of FIG. 1. Typically, the semiconductor wafer is a slice of silicon .400 x .400 x .020 inch and the diffusion-resistant coating is a thermally grown oxide coating of about 10,000 Angstrom units. One method for growing a suitable oxide coating is by oxidation in a steam atmosphere as disclosed in my Patent No. 2,930,722, issued March 29, 1960. As indicated by block II, the coated wafer is placed inside an inert enclosure which is provided with a window transparent to radiation. The enclosure then is filled with a gaseous mixture formed by bubbling $NF_3$ gas through liquid bromine. Typically, room temperature and atmospheric pressure conditions are maintained. Subsequently, incident radiation in accordance with a pattern, as provided, for example, by directing light from an ordinary incandescent lamp through a mask designed to shadow regions to be etched, is directed through the transparent window at the coated surface of the semiconductor wafer. This procedure is indicated in FIG. 1 by blocks III and IV, respectively.

Figure 2:
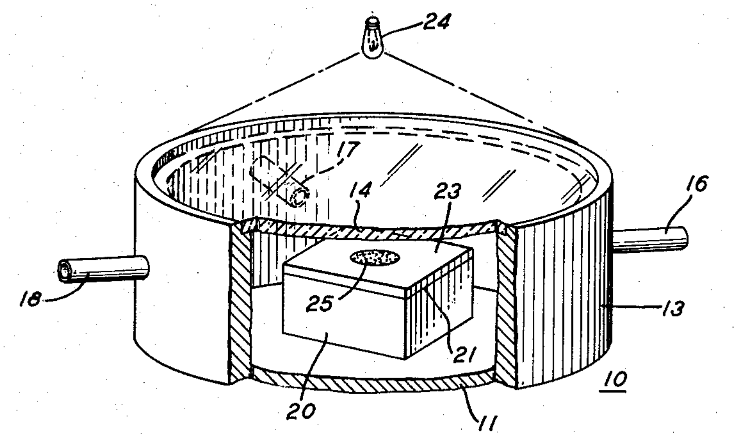
FIG. 2 is an arrangement convenient for practicing the method of this invention.

The arrangement of FIG. 2 has been found particularly convenient for the practice of the method of FIG. 1. The receptacle or enclosure 10 conveniently is cylindrical in shape having a disk-shaped portion 11 connected to one end of tubular portion 13 and a disk-shaped portion 14 detachably secured to the opposite end. Typically, the disk-shaped portion 14 is of a material such as calcium fluoride which is transparent to the radiation employed and inert to the enclosed gases and the reaction products. Moreover, the rest of the enclosure is fabricated from, for example, copper or quartz lined with platinum. Of course, it is feasible to form such enclosure of other suitable materials which are inert to the gases employed at the temperatures used.

Inlet 16 is connected to a supply (not shown) of the gaseous mixture such as $NF_3$ and $Br_2$; inlet 17 is connected to a supply (not shown) of an inert gas such as nitrogen used for flushing out the system prior to use in accordance with this invention. Outlet 18 is connected to a sink (not shown) for the disposal of the contaminated and unused gas.

A suitable starting material 20 such as an oxide-coated silicon wafer is positioned inside the receptacle 10. A major surface 21 of the starting material is positioned substantially parallel to the transparent disk portion 14.

A mask 23 is positioned between the radiation source 24 and the surface 21. Advantageously, the mask comprises a transparent element such as calcium fluoride on a selected portion of which is evaporated an opaque coating 25 of a material such as aluminum and the shadowed area produced on surface 21 by opaque portion 25 is substantially less than (typically less than one-hundredth of) the area of the surface 21.

Typically, mask 23 is positioned beneath disk portion 14 substantially in contact with surface 21. In this case the mask is made of material such as calcium fluoride coated appropriately with a suitable opaque material such as aluminum which does not react with the gaseous ambient. Means for maintaining the receptacle 10, the mask 23 and the radiation source 24 in spaced relation comprises well known support and clamping means (not shown).

Figure 3:
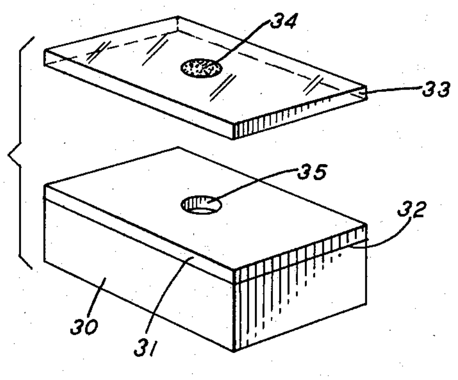
FIG. 3 is a typical mask and the shape layer of material resulting from irradiation through the mask.

In one example of the practice of the invention, the slice of silicon 30 shown in FIG. 3 is positioned within the receptacle, approximately one inch from the radiation source which is, typically, a 100-watt high pressure mercury lamp. Slice 30 has an overlayer of silicon dioxide 31 thermally grown on surface 32 of the slice. Mask 33 is positioned substantially in contact with overlayer 31 and is provided with at least one opaque portion 34 for delineating the desired etch pattern 35. A mixture of $NF_3$ and $Br_2$ gas is introduced to the receptacle at room temperature and atmospheric pressure. The radiation source is operated conveniently from a 250-watt transformer and the pattern 35 is formed in less than three hours.

It is not necessary for the mask to be in contact with overlayer 31. In some instances contact is undesirable. For example, in the automation of a process in accordance with this invention, it may be desirable to position the slice 30 on a conveyer belt in which case contact between the mask and the slice would hinder the consequent relative motion. Similarly, it may be advantageous in certain instances to remove the mask from the receptacle 10 or merely to project an image at overlayer 31.

In either instance it is required in accordance with this invention only that a pattern of radiation, having at least one shadowed portion, be directed at the surface to be etched thereby establishing on the surface to be etched contiguous irradiated and nonirradiated areas.

An explanation advanced to account for the effect of the incident radiation in causing etching of the shadowed areas is as follows. The immediate effect of the incident radiation is to dissociate the bromine molecules into bromine atoms which diffuse through the entire enclosure but do not etch the silicon dioxide coating. The conditions for recombination of the bromine atoms are satisfied at the surface of the silicon dioxide coating in the shadowed regions only, conditions in the illuminated areas being unfavorable. Specifically, the bromine atoms which diffuse (via the gas phase) into the shadowed region give up some of their excitation energy through fluorescence and so acquiesce to the adsorption forces at the shadowed surface portion. Since adsorption is a prerequisite for recombination, these atoms subsequently recombine. In the illuminated regions the atoms are too energetic to acquiesce to the adsorption forces at the illuminated portion of the surface and consequently recombination is impossible there. On recombination the energy or heat of recombination is transferred to the surface of the silicon dioxide coating which, accordingly, undergoes a corresponding localized increase in temperature. The $NF_3$ which reacts with silicon dioxide at elevated temperatures (in excess of 600 degrees centigrade) is activated by this localized heating and etches the silicon dioxide only in the shadowed areas.

The bromine then acts as a convenient means for selectively heating the silicon dioxide surface, and the $NF_3$ immedaitely thereafter acts as a heat-activated gas to selectively etch the silicon dioxide. In this connection a heat-activated gas is one which is unreactive at room temperature with the selected substrate but which reacts with the substrate at suitably high temperatures. Therefore, under the influence of the energy provided by the radiation and delivered by the recombination phenomenon, the heat-activated gas attacks the substrate directly and does not dissociate into reactive elements. The pattern of the mask is reproduced with high fidelity.

Examples of other gases which fall into the class of heat-activated gases are difluorodiazine ($N_2F_2$) and tetrafluorohydrazine ($N_2F_4$). Moreover, other dissociable gases such as oxygen, hydrogen, chlorine, fluorine and iodine and halogen acids, or hydrides of the halogen gases such as HCl, HBr and HI, as well as bromine are suitable for delivering the incident radiant energy to selected portions of the layer to be etched. Fluorine typically is difficult to handle but can be used in the manner described if it is formed in situ by, for example, the radiation dissociataion of some fluorine compound such as $IF_5$ (iodine pentafluoride), $F_2O$ (fluorine monoxide) and $BrF_3$ (bromine trifluoride).

Gaseous semiconductor halides such as germanium and silicon tetrabromides and tetrachlorides also are useful in etching layers of the corresponding semiconductor material in accordance with this invention. These semiconductor halides often already include impurities such as $Br_2$ and $Cl_2$ and, accordingly, may exhibit the described reaction without additional dissociable gases.

The wavelength of the radiation employed is conveniently 6,300, 4,890 and 8,125 Angstrom units and below for bromine, chlorine and iodine, respectively. Typical radiataion sources such as incandescent lamps and mercury arcs provide radiation over a wide range of wavelengths including the range preferred.

The time required for producing the desired pattern depends, for any given material and distance between the material and the radiation source, on the incident radiation intensity. For example, oxide coating 31 is typically 10,000 Angstrom units thick. Subjecting such a coating in an $NF_3$ plus $Br_2$ ambient to radiation from a 100-watt high pressure mercury lamp requires in excess of an hour to exposure the surface of the silicon slice. However, as the wattage is increased the time required to expose the silicon slice is decreased. In the described embodiment no attempt is made to collimate the radiation or increase the radiation delivered to the workpiece. However, efforts in this direction would increase the etch-rate substantially. Specifically, an increase in the delivered radiant energy increases the production of atomic bromine and consequently increases the etch-rate. Moreover, experiments indicate that the initial etch-rate in response to the radiaation is relatively high and then diminishes. Accordingly, pulsed radiation can be used to advantage.

For use with compounds like $IF_5$ and $F_2O$ which tend to etch the illuminated portion of a silicon oxide coating, for the practice of the present invention, that is, the etching of shadowed portions, it is important to supply radiation sufficiently energetic to dissociate such compounds into molecular fluorine and inert components sufficiently quickly and completely before etching of the illuminated portion can occur. After such dissociation, the dissociation products act in the manner described to etch shadowed portions.

The products of the reaction between the $NF_3$ and the layer of material etched are nitrogen oxide and fluorides of the etched material. Accordingly, the system is capable of etching any layer comprising material which forms a fluoride volatile below the temperature at which the heat-activated gas reacts with the material, or, for example, about 600 degrees centigrade for $NF_3$. Most elements which lie in the fourth column or higher of the Periodic Chart of the Atoms as described at length in "Fluorine Chemistry" edited by J. H. Simons, an Academic Press, Inc. 1950 publication, and their compounds, can be etched in accordance with this invention. The notable exceptions to this generality are the rare earths, the inert gases, helium, neon, argon, krypton, xenon and radon, and iron, cobalt, nickel, palladium and platinum.

Normally, processes in accordance with this invention are carried out at room temperature where a high degree of control is afforded, for example, through control of the incident radiation intensity. Nevertheless, the temperature may be increased or decreased without substantial effect on the efficacy of the invention. However, it is to be kept in mind that at critically high temperatures the heat-activated gases react uniformly with the substrate and no selectivity is obtained. For $NF_3$ and silicon dioxide this critical temperature is about 600 degrees centigrade. Accordingly, it is not desirable to exceed this operating temperature, for example, the $NF_3$ plus $Br_2$ system.

It may be appreciated that the ultimate resolution achievable with the method of this invention is a complicated function and substantially undetermined at present. For example, the energy of recombination, a factor in determining the resolution when transferred to the silicon dioxide coating, may effect an area of only 10–20 Angstrom units of the coating. Accordingly, the effect of the thermal conductivity exhibited normally by the silicon dioxide coating on the degree of resolution is not obvious. However, a high degree of resolution can be achieved consistently. For example, patterns have been etched in silicon dioxide coatings in accordance with this invention which have edges defined to within a fraction of a mil.

One example of a particular etching run conducted with an oxide-coated silicon slice is as follows.

A slice of silicon semiconductor material .400 x .400 x .020 inch was heated under pressure in steam to grow a silicon dioxide coating about 10,000 Angstrom units thick over the entire surface of the slice. The resulting oxide encrusted slice was exposed at atmospheric pressure and room temperature to a gaseous mixture of $NF_3$ and $Br_2$ (446 millimeters and 214 millimeters, respectively) in the enclosure illustrated in FIG. 2. A static system (zero gas flow rate) was used. A calcium fluoride mask including an aluminum pattern was placed in contact with a major surface of the slice. The mask was about .400 x .400 x .010 inch and included a plurality of aluminum dots about .006 inch in diameter. A 100-watt (Hanovia-type SH–100) high pressure mercury lamp operated from a 250-watt transformer was positioned about one inch from the surface of the oxide overlayer. In less than three hours the surface of the silicon substrate was selectively exposed in accordance with the pattern.

Further examples including a suitable workpiece or starting material with which the method of this invention is useful are substantially as disclosed in the copending application noted above. More specifically, these materials recited explicitly therein are tantalum, chromium, tungsten, zirconium oxide, titanium oxide, silicon monoxide, silicon dioxide, and both silicon monoxide and dioxide on various bases such as silicon, germanium, gallium arsenide and copper. It is to be understood, however, that the geometry formed in accordance with this invention is the negative of the geometry produced therein.

The above described illustrative embodiments are susceptible of numerous and varied modifications, all clearly within the spirit and scope of the principles of the present invention, as will at once be apparent to those skilled in the art. No attempt has been made here to illustrate exhaustively all such possibilities.

For example, oxygen and hydrogen ($O_2$ and $H_2$) can be made to dissociate under the influence of radiation in the far ultraviolet range and transfer heat in accordance with this invention. Also, both oxygen and hydrogen are dissociated by radiation of 2,537 Angstrom units in the presence of mercury vapor, as is well known.

What is claimed is:

1. A method for selectively etching a desired pattern on a workpiece capable of forming halides which are substantially completely volatile at the processing temperature, said method comprising positioning the workpiece in ambient gases including a heat-activated halide gas capable of forming said halides with said workpiece for etching the surface of the workpiece when activated and a light-dissociable gas capable of being dissociated by incident radiation and of recombining in the absence of such radiation with a release of energy, positioning over said workpiece a mask for shadowing a portion thereof to be etched and providing radiation capable of dissociating enough of said light-dissociable gas for raising the temperature of said shadowed portions to a processing temperature sufficient to cause localized etching there while little affecting the illuminated portions.

2. A method for selectively etching a layer of substrate material which forms a halide substantially completely volatile at the processing temperature, said method comprising including said layer of substrate material in an inert enclosure, said enclosure also including a mixture of at least a first and a second gas, the first gas selected from a class of heat-activated gases consisting of $NF_3$, $N_2F_2$, $N_2F_4$, $GeBr_4$, $GeCl_4$, $SiBr_4$, $SiCl_4$, $IF_5$, $BrF_3$ and $F_2O$, the second selected from a class consisting of $Cl_2$, $Br_2$, $F_2$, $O_2$, $H_2$, $I_2$, HCl, HBr and HI, heating to a processing temperature above that at which said halide becomes volatile but below the temperature at which said heat-activated gas reacts with said substrate material, and exposing in accordance with a mask pattern said layer of substrate material to radiation of a wavelength to dissociate said second gas for heating additionally the shadowed portions of said layer to etch selectively said shadowed portions while little affecting the irradiated portions.

3. A method for fabricating a substrate of desired geometry from a layer of substrate material capable of forming fluoride substantially completely volatile at the processing temperature, said method comprising the steps of exposing the surface of said layer of substrate material to a gaseous mixture of $NF_3$ and $Br_2$, and directing at said surface radiation in accordance with a mask pattern, said radiation being of a wavelength suitable for dissociating said $Br_2$ and for a time to selectively etch the shadowed portions of said surface while little affecting the irradiated portions.

4. In the fabrication of a diffused semiconductor device from a class of materials consisting of silicon, germanium and gallium arsenide including a significant impurity of a first conductivity type, the steps of coating a surface of said wafer with a diffusion-resistant material capable of forming a halide substantially completely volatile at the processing temperature, exposing said diffusion-resistant material to a gaseous mixture of at least a first and a second gas, said first gas selected from the class consisting of $F_2O$, $IF_5$, $BrF_3$, $GeBr_4$, $GeCl_4$, $SiBr_4$, $SiCl_4$, $NF_3$, $N_2F_2$ and $N_2F_4$, said second gas selected from the class consisting of $F_2$, $Br_2$, $Cl_2$, $H_2$, $O_2$, HCl, HBr, HI, and $I_2$, directing at the coated surface of the wafer radiation in accordance with a mask pattern for a time to selectively etch the shadowed portions of the coating of said diffusion-resistant material while little affecting the irradiated portions thereof, said radiation being of a wavelength to dissociate said second gas molecules, and exposing said wafer to a vapor including a significant impurity of a second conductivity type for converting the conductivity type of a surface portion of said wafer.

5. A method for selectively etching a layer of substrate material capable of forming a fluoride substantially completely volatile at the processing temperature, said method comprising the steps of exposing said layer of substrate material to a gas selected from the group consisting of $F_2O$, $IF_5$ and $BrF_3$ and directing radiation in accordance with a pattern at said layer of substrate material, said radiation being of an intensity to form molecular fluorine from said gas before said gas etches the illuminated portions of said layer, said radiation being of a wavelength for dissociating said molecular fluorine and for a time to heat to a processing temperature the shadowed portion of said layer to selectively etch said shadowed portions while little affecting the irradiated portions.

6. In the fabrication of a semiconductor device from a silicon semiconductor wafer, the steps of coating a silicon slice with an oxide layer, exposing the coated slice to a gaseous mixture of at least a first and a second gas, said first gas being selected from a class consisting of $NF_3$, $N_2F_2$ and $N_2F_4$, said second gas comprising $Br_2$, and directing radiation in accordance with a pattern at a surface of said silicon slice for a time to selectively etch the shadowed portions of said surface, said radiation having a wavelength of less than 6,330 Angstrom units.

7. In the fabrication of a semiconductor device from a silicon semiconductor wafer, the steps of growing on said silicon slice an oxide coating, exposing the coated slice to a gaseous mixture of at least a first and a second gas, said first gas being selected from a class consisting of $SiBr_4$, $SiCl_4$, $NF_3$, $N_2F_2$ and $N_2F_4$, said second gas consisting of $Cl_2$, and directing radiation in accordance with a pattern at a surface of said silicon slice for a time to selectively etch the shadowed portions of said surface, said radiation having a wavelength of less than 4,890 Angstrom units.

8. In the fabrication of a semiconductor device from a silicon semiconductor wafer, the steps of exposing said wafer to a gaseous mixture of at least a first and a second gas, said first gas being selected from a class of heat-activated gases consisting of $IF_5$, $BrF_3$, $NF_3$, $N_2F_2$, $N_2F_4$, $SiBr_4$ and $SiCl_4$, said second gas being selected from a class of dissociable gases consisting of $F_2$, $Cl_2$, $Br_2$, $I_2$, $O_2$, HCl, HBr, HI and $H_2$, and directing radiation in accordance with a pattern at a surface of said silicon slice for a time to selectively etch the shadowed portions of said surface, said radiation being of a wavelength to dissociate said second gas into atoms.

9. In the fabrication of a semiconductor device from a germanium semiconductor wafer, the steps of exposing said wafer to a gaseous mixture of at least a first and a second gas, said first gas being selected from a class of heat-activated gases consisting of $NF_3$, $N_2F_2$, $N_2F_4$, $GeBr_4$ and $GeCl_4$, said second gas being selected from a class of dissociable gases consisting of $F_2$, $Cl_2$, $Br_2$, $I_2$, $O_2$, HCl, HBr, HI and $H_2$, and directing radiation in accordance with a pattern at a surface of said germanium slice for a time to selectively etch the shadowed portions of said surface, said radiation being of a wavelength to dissociate said second gas into atoms.

References Cited in the file of this patent

UNITED STATES PATENTS

| | | |
|---|---|---|
| 2,802,760 | Derick et al. | Aug. 13, 1957 |
| 2,841,477 | Hall | July 1, 1958 |
| 2,916,681 | Brady et al. | Dec. 8, 1959 |

OTHER REFERENCES

Mellor: Comprehensive Treatise on Inorganic and Theoretical Chemistry, November 30, 1956, Supplement II, Part 1, p. 191.